(12) United States Patent
Nimbalker et al.

(10) Patent No.: US 7,493,548 B2
(45) Date of Patent: Feb. 17, 2009

(54) METHOD AND APPARATUS FOR ENCODING AND DECODING DATA

(75) Inventors: Ajit Nimbalker, Schaumburg, IL (US); Yufei Blankenship, Streamwood, IL (US); Brian Classon, Palatine, IL (US)

(73) Assignee: Motorola, Inc, Schaumburg, IL (US)

( * ) Notice: Subject to any disclaimer, the term of this patent is extended or adjusted under 35 U.S.C. 154(b) by 518 days.

(21) Appl. No.: 11/275,937

(22) Filed: Feb. 6, 2006

(65) Prior Publication Data

US 2007/0220395 A1 Sep. 20, 2007

(51) Int. Cl.
*H03M 13/00* (2006.01)

(52) U.S. Cl. .................. 714/758; 714/801; 714/786; 714/755

(58) Field of Classification Search .............. 714/786, 714/755, 752, 801, 758
See application file for complete search history.

(56) References Cited

U.S. PATENT DOCUMENTS

| 5,956,351 | A  | * | 9/1999  | Bossen et al. ............. 714/757 |
| 7,464,323 | B2 | * | 12/2008 | Piret et al. ................ 714/781 |
| 2004/0221223 | A1 | | 11/2004 | Yu et al. |
| 2005/0246617 | A1 | | 11/2005 | Kyung et al. |
| 2005/0257119 | A1 | | 11/2005 | Blankenship et al. |

* cited by examiner

*Primary Examiner*—Guy J Lamarre

(57) ABSTRACT

A structured parity-check matrix H is proposed, wherein H is an expansion of a base matrix $H_b$ and wherein $H_b$ comprises a section $H_{b1}$ and a section $H_{b2}$, and wherein $H_{b2}$ comprises a first part comprising a column $h_b$ having an odd weight greater than 2, and a second part comprising matrix elements for row i, column j equal to 1 for i=j, 1 for i=j+1, and 0 elsewhere. The expansion of the base matrix $H_b$ uses identical submatrices for 1s in each column of the second part $H'_{b2}$, and the expansion uses paired submatrices for an even number of 1s in $h_b$.

16 Claims, 4 Drawing Sheets

300

400

METHOD AND APPARATUS FOR ENCODING AND DECODING DATA

FIELD OF THE INVENTION

The present invention relates generally to encoding and decoding data and in particular, to a method and apparatus for encoding and decoding data utilizing low-density parity-check (LDPC) codes.

BACKGROUND OF THE INVENTION

As described in U.S. patent application Ser. No. 10/839,995, which is incorporated by reference herein, a low-density parity-check (LDPC) code is a linear block code specified by a parity-check matrix H. In general, an LDPC code is defined over a Galois Field GF(q), $q \geq 2$. If q=2, the code is a binary code. All linear block codes can be described as the product of a k-bit information vector $s_{1 \times k}$ with a code generator matrix $G_{k \times n}$ to produce an n-bit codeword $x_{1 \times n}$, where the code rate is r=k/n. The codeword x is transmitted through a noisy channel, and the received signal vector y is passed to the decoder to estimate the information vector $S_{1 \times k}$.

Given an n-dimensional space, the rows of G span the k-dimensional codeword subspace C, and the rows of the parity-check matrix $H_{m \times n}$ span the m-dimensional dual space $C^{\perp}$, where m=n−k. Since x=sG and $GH^T=0$, it follows that $xH^T=0$ for all codewords in subspace C, where "T" (or "$^T$") denotes matrix transpose. In the discussion of LDPC codes, this is generally written as $$Hx^T = 0^T, \quad (1)$$

where 0 is a row vector of all zeros, and the codeword x=[s p]=$[s_0, s_1, \ldots, s_{k-1}, p_0, p_1, \ldots, p_{m-1}]$, where $p_0, \ldots, p_{m-1}$ are the parity-check bits; and $s_0, \ldots, s_{k-1}$ are the systematic bits, equal to the information bits within the information vector.

For an LDPC code the density of non-zero entries in H is low, i.e., there are only a small percentage of 1's in H, allowing better error-correcting performance and simpler decoding than using a dense H. A parity-check matrix can be also described by a bipartite graph. The bipartite graph is not only a graphic description of the code but also a model for the decoder. In the bipartite graph, a codeword bit (therefore each column of H) is represented by a variable node on the left, and each parity-check equation (therefore each row of H) is represented by a check node on the right. Each variable node corresponds to a column of H and each check node corresponds to a row of H, with "variable node" and "column" of H referred to interchangeably, as are "check node" and "row" of H. The variable nodes are only connected to check nodes, and the check nodes are only connected to variable nodes. For a code with n codeword bits and m parity bits, variable node $v_i$ is connected to check node $c_j$ by an edge if codeword bit i participates in check equation j, i=0, 1, …, n−1, j=0, 1, …, m−1. In other words, variable node i is connected to check node j if entry $h_{ji}$ of the parity-check matrix H is 1. Mirroring Equation (1), the variable nodes represent a valid codeword if all check nodes have even parity.

An example is shown below to illustrate the relationship between the parity-check matrix, the parity-check equations, and the bipartite graph. Let an n=12, rate−½ code be defined by $$H = \begin{bmatrix} 1 & 0 & 1 & 0 & 0 & 0 & 1 & 1 & 0 & 0 & 0 & 0 \\ 0 & 1 & 0 & 0 & 1 & 0 & 0 & 1 & 1 & 0 & 0 & 0 \\ 0 & 0 & 1 & 0 & 0 & 1 & 1 & 0 & 1 & 1 & 0 & 0 \\ 1 & 0 & 0 & 1 & 0 & 0 & 0 & 0 & 0 & 1 & 1 & 0 \\ 0 & 1 & 0 & 0 & 1 & 0 & 0 & 0 & 0 & 0 & 1 & 1 \\ 0 & 0 & 0 & 1 & 0 & 1 & 1 & 0 & 0 & 0 & 0 & 1 \end{bmatrix} \right\} m, \quad (2)$$

with the left side portion corresponding to k (=6) information bits s, the right side portion corresponding to m (=6) parity bits p. Applying (1), the H in (2) defines 6 parity-check equations as follows:

$$\begin{cases} x_0 + x_2 + x_6 + x_7 = 0 \\ x_1 + x_4 + x_7 + x_8 = 0 \\ x_2 + x_5 + x_6 + x_8 + x_9 = 0 \\ x_0 + x_3 + x_9 + x_{10} = 0 \\ x_1 + x_4 + x_{10} + x_{11} = 0 \\ x_3 + x_5 + x_6 + x_{11} = 0. \end{cases} \quad (3)$$

H also has the corresponding bipartite graph shown in FIG. 1.

As discussed above, the receiver obtains a contaminated version y of the transmitted codeword x. To decode y and determine the original information sequence s, an iterative decoding algorithm, such as belief propagation, is applied based on the bipartite graph. Soft information in the format of log-likelihood ratio (LLRs) of the codeword bits is passed between the bank of variable nodes and the bank of check nodes. The iteration is stopped either when all check equations are satisfied or a maximum allowed iteration limit is reached.

A structured LDPC code design starts with a small $m_b \times n_b$ base matrix $H_b$, makes z copies of $H_b$, and interconnects the z copies to form a large m×n H matrix, where $m=m_b \times z$, $n=n_b \times z$. Using the matrix representation, to build an H from $H_b$ each 1 in $H_b$ is replaced by a z×z permutation submatrix (square subblock), and each 0 in $H_b$ is replaced by a z×z all-zero submatrix. This procedure essentially maps each edge of $H_b$ to a vector edge of length z in H, each variable node of $H_b$ to a vector variable node of length z in H, and each check node of $H_b$ to a vector check node of length z in H. The benefits of vectorizing a small matrix $H_b$ to build a large matrix H are:

1. By using a different values of z, codes of rate $k_b/n_b$, where $k_b = n_b - m_b$, can be designed for many different information sequence sizes $k = z \times k_b$ from a single base matrix $H_b$.
2. Memory requirements are greatly reduced. With a structured LDPC design, only the base matrix $H_b$ and the permutation for its 1's need to be stored, which requires significantly less memory since $H_b$ is typically much smaller than H and the permutation can be very simple.
3. Encoding and decoding can be performed on groups of bits rather than by single bits. For example, a group of z messages can be fetched from memory, permuted, and passed between a vector variable node and a vector check node.

Although the structured LDPC design philosophy greatly reduces the implementation complexity, a technique does not exist for designing the base matrix and assigning the permutation matrices for a given target H size which results in a LDPC code that has good error-correcting performance and can be efficiently encoded and decoded. Therefore, a need exists for a method and apparatus for designing a structured H and a method and apparatus for encoding and decoding data utilizing the structured H matrix.

DETAILED DESCRIPTION OF THE DRAWINGS

Figure 1:
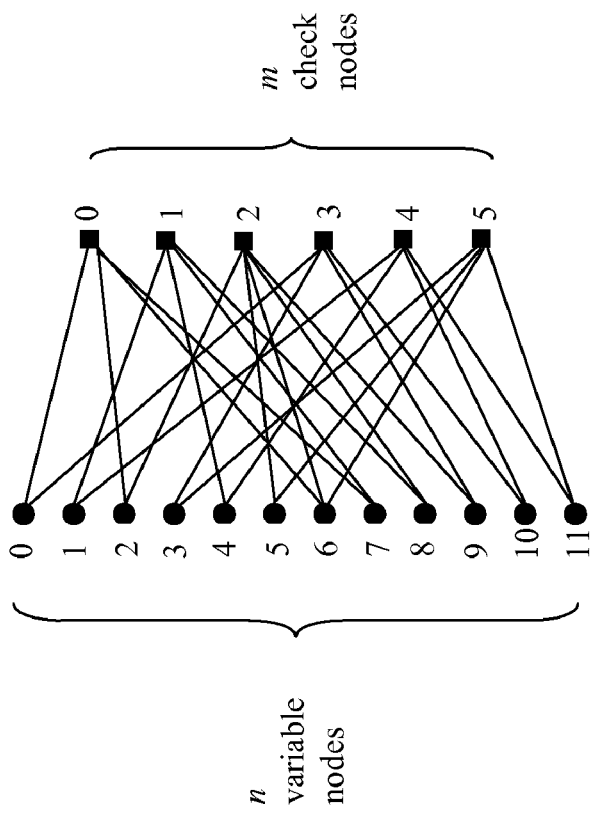
FIG. 1 illustrates the bipartite graph of an (12, 6) H matrix.

To address the above-mentioned need, a structured parity-check matrix H is proposed, wherein H is an expansion of a base matrix $H_b$, and wherein $H_b$ comprises a section $H_{b1}$ and a section $H_{b2}$, and wherein $H_{b2}$ comprises a first part comprising a column $h_b$ having an odd weight greater than 2, and a second part comprising matrix elements for row i, column j equal to 1 for i=j, 1 for i=j+1, and 0 elsewhere. The expansion of the base matrix $H_b$ uses identical submatrices for 1s in each column of the second part $H'_{b2}$, and the expansion uses paired submatrices for an even number of 1s in $h_b$.

The present invention encompasses a method for operating a transmitter that generates parity-check bits $p=(p_0, \ldots, p_{m-1})$ based on a current symbol set $s=(s_0, \ldots, s_{k-1})$. The method comprises the steps of receiving the current symbol set $s=(s_0, \ldots, s_{k-1})$, and using a matrix H to determine the parity-check bits. The parity-check bits are transmitted along with the current symbol set. Matrix H is an expansion of a base matrix $H_b$ where $H_b$ comprises a section $H_{b1}$ and a section $H_{b2}$, and wherein $H_{b2}$ comprises a first part comprising a column $h_b$ having an odd weight greater than 2, and a second part $H'_{b2}$ comprising matrix elements for row i, column j equal to 1 for i=j, 1 for i=j+1, and 0 elsewhere. The expansion of the base matrix $H_b$ uses identical submatrices for 1s in each column of the second part $H'_{b2}$, and wherein the expansion uses paired submatrices for an even number of 1s in $h_b$.

The present invention additionally encompasses a method for operating a receiver that estimates a current symbol set $s=(s_0, \ldots, s_{k-1})$. The method comprises the steps of receiving a received signal vector $y=(y_0 \ldots y_{n-1})$ and using a matrix H to estimate the current symbol set $s=(s_0, \ldots, s_{k-1})$. Matrix H is an expansion of a base matrix $H_b$ and wherein $H_b$ comprises a section $H_{b1}$ and a section $H_{b2}$, with $H_{b2}$ comprising a first part comprising a column $h_b$ having an odd weight greater than 2, and a second part $H'_{b2}$ comprising matrix elements for row i, column j equal to 1 for i=j, 1 for i=j+1, and 0 elsewhere. The expansion of the base matrix $H_b$ uses identical submatrices for 1s in each column of the second part $H'_{b2}$, and wherein the expansion uses paired submatrices for an even number of 1s in $h_b$.

The present invention additionally encompasses an apparatus comprising storage means for storing a matrix H, a microprocessor using a matrix H to determine parity-check bits, wherein H is an expansion of a base matrix $H_b$ and $H_b$ comprises a section $H_{b1}$ and a section $H_{b2}$, with $H_{b2}$ comprising a first part comprising a column $h_b$ having an odd weight greater than 2, and a second part $H'_{b2}$ comprising matrix elements for row i, column j equal to 1 for i=j, 1 for i=j+1, and 0 elsewhere. The expansion of the base matrix $H_b$ uses identical submatrices for 1s in each column of the second part $H'_{b2}$, and wherein the expansion uses paired submatrices for an even number of 1s in $h_b$.

The present invention encompasses an apparatus comprising storage means for storing a matrix H, a receiver for receiving a signal vector $y=(y_0 \ldots y_{n-1})$, and a microprocessor using a matrix H to determine a current symbol set $(s_0, \ldots, s_{k-1})$. Matrix H is an expansion of a base matrix $H_b$ with $H_b$ comprising a section $H_{b1}$ and a section $H_{b2}$, and wherein $H_{b2}$ comprises a first part comprising a column $h_b$ having an odd weight greater than 2. $H_{b2}$ comprises a second part $H'_{b2}$ having matrix elements for row i, column j equal to 1 for i=j, 1 for i=j+1, and 0 elsewhere. Two identical submatrices are used to expand is in every column of $H'_{b2}$, and paired submatrices are used to expand an even number of 1s in $h_b$.

Figure 3:
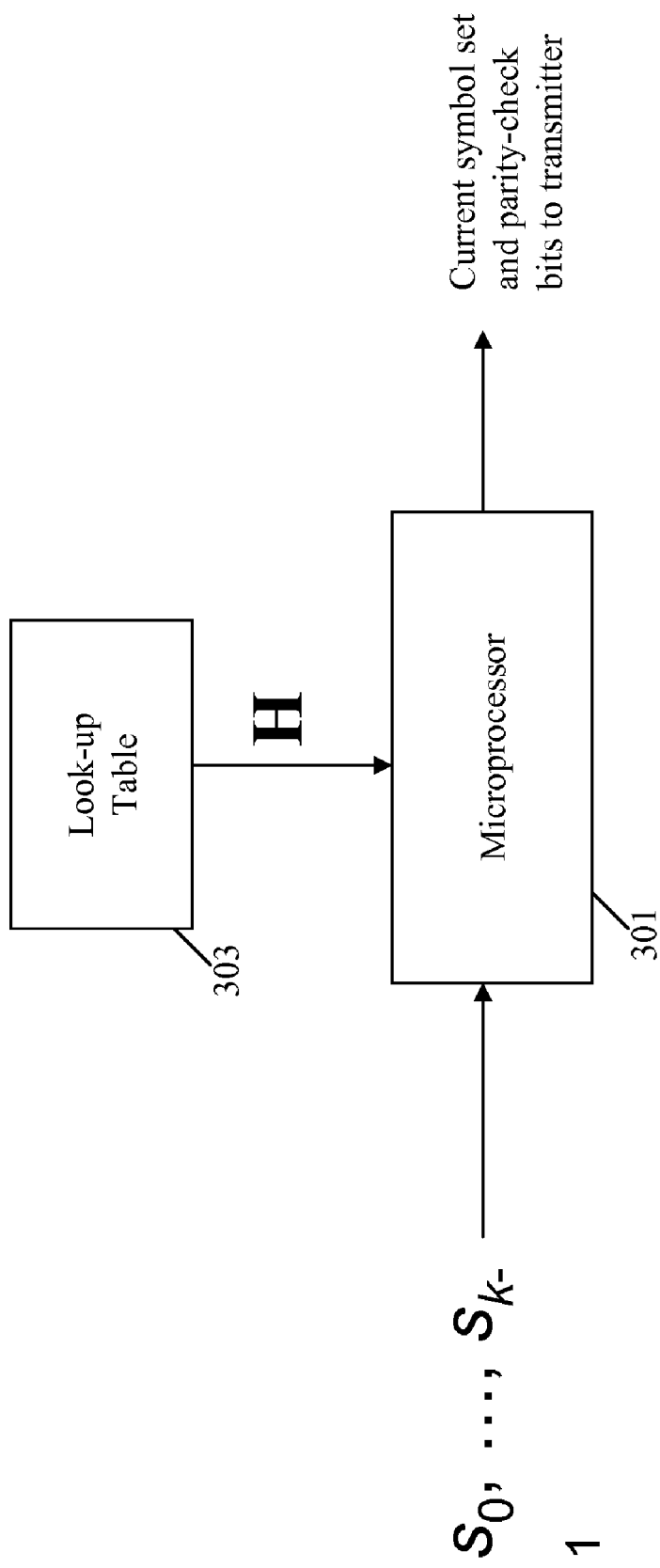
FIG. 3 is a block diagram of an encoder.

Turning now to the drawings, wherein like numerals designate like components, FIG. 3 is a block diagram of encoder 300 in accordance with a first embodiment of the present invention. As shown, encoder 300 comprises microprocessor 301 and lookup table 303. In the first embodiment of the present invention, microprocessor 301 comprises a digital signal processor (DSP), such as, but not limited to MSC8300 and DSP56300 DSPs. Additionally, lookup table 303 serves as storage means to store a matrix, and comprises read-only memory; however, one of ordinary skill in the art will recognize that other forms of memory (e.g., random-access memory, magnetic storage memory, etc.) may be utilized as well. In a second embodiment, the functionality of the microprocessor 301 and the lookup table 303 can be incorporated into an application specific integrated circuit (ASIC) or field programmable gate array (FPGA). In particular, the lookup table 303 can be implemented in a form of memory corresponding to the existence or non-existence of signal paths in a circuit.

As discussed above, encoded data is generally output as a plurality of parity-check bits in addition to the systematic bits, where together the parity-check and systematic bits form a codeword x. In the first embodiment of the present invention, a parity-check matrix H is stored in lookup table 303, and is accessed by microprocessor 301 to solve Equation (1). In particular, microprocessor 301 determines appropriate values for the parity-check bits $p=(p_0, \ldots, p_{m-1})$ based on the current symbol set $s=(s_0, \ldots, s_{k-1})$ and the parity-check matrix H. The parity-check bits and the symbol set are then passed to a transmitter and transmitted to a receiver.

Figure 4:
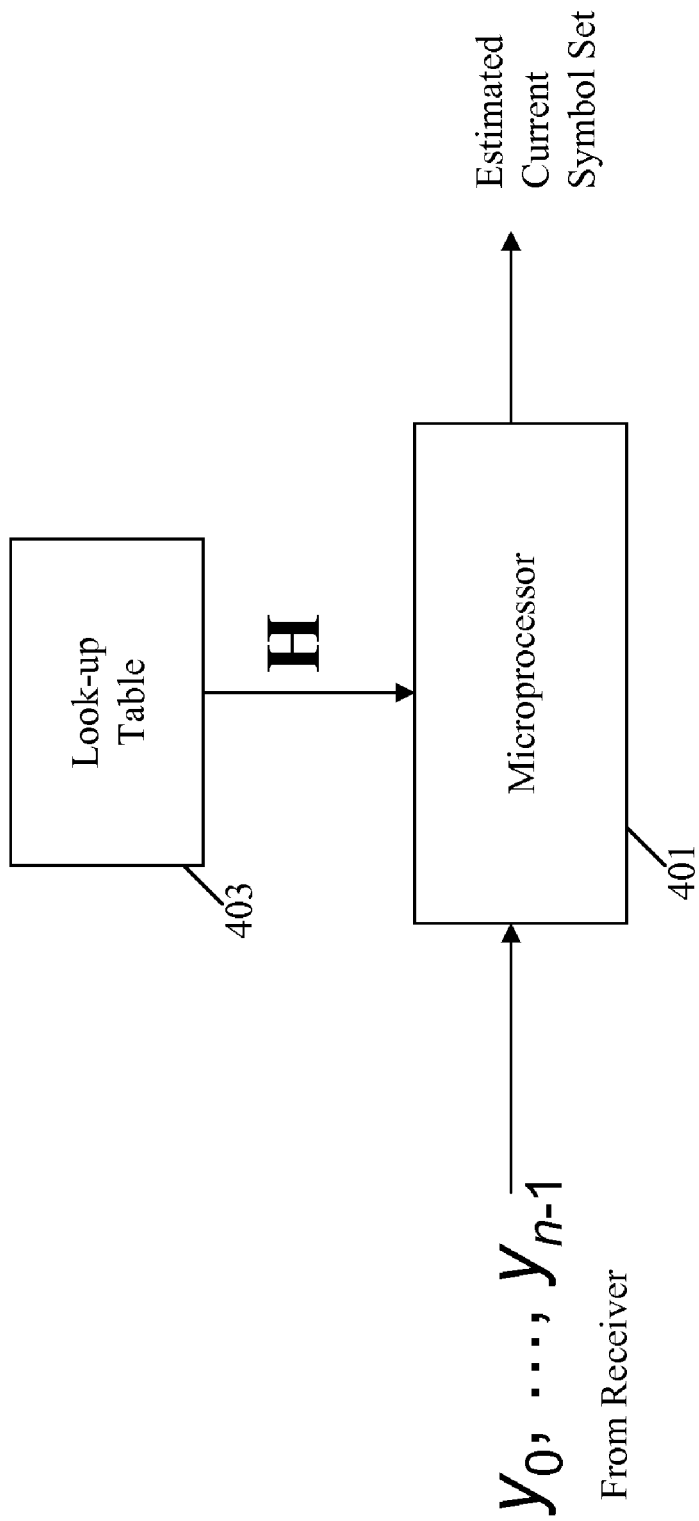
FIG. 4 is a block diagram of a decoder.

FIG. 4 is a block diagram of decoder 400 in accordance with one embodiment of the present invention. As shown, decoder 400 comprises microprocessor 401 and lookup table 403. In a first embodiment of the present invention, microprocessor 401 comprises a digital signal processor (DSP), such as, but not limited to MSC8300 and DSP56300 DSPs. Additionally, lookup table 403 acts as storage means for storing matrix H, and comprises read-only memory. However, one of ordinary skill in the art will recognize that other forms of memory (e.g., random-access memory, magnetic storage memory, etc.) may be utilized as well. In a second embodiment, the functionality of the microprocessor 401 and the lookup table 403 can be incorporated into an application specific integrated circuit (ASIC) or field programmable gate array (FPGA). In particular, the lookup table 403 can be implemented in a form of memory corresponding to the existence or non-existence of signal paths in a circuit.

The received signal vector (received via a receiver) $y=(y_0, \ldots, y_{n-1})$ corresponds to the codeword x transmitted through a noisy channel, where the encoded data x, as discussed above, is a codeword vector. In the first embodiment of the present invention, a parity-check matrix H is stored in lookup table 403, and is accessed by microprocessor 401 to decode y and estimate the current symbol set s (i.e., the current symbol set $(s_0, \ldots, s_{k-1})$). In particular, microprocessor 401 estimates the current symbol set $(s_0, \ldots, s_{k-1})$ based on the received signal vector $y=(y_0, \ldots, y_{n-1})$ and the parity-check matrix H.

As is well known in the art, there are many ways the decoder 400 can use the parity-check matrix H in the microprocessor 401 for decoding. One such way is to perform a vector-matrix multiplication with H to determine a likely error pattern. Another such way is to use H to construct a bipartite graph where the edges in the graph correspond to 1's in H, and to iteratively process y on the bipartite graph.

For a structured LDPC, the z×z submatrix may be a permutation matrix, a sum of permutation matrices, or any type of binary matrix. Since a permutation matrix P has a single 1 in each row and a single 1 in each column, the weight distribution of the expanded matrix H is the same as the base matrix $H_b$ if the permutation submatrix is used. Therefore, the weight distribution of $H_b$ is chosen as close to the desired final weight distribution as possible. The following description is illustrative of the case where the entries of $H_b$ are replaced by permutation matrices, though any matrices may be used. If a permutation submatrix $P_{z \times z}$ of a vector edge has a 1 at (row, column) entry (p(i), i), then the i-th edge within the vector edge is permuted to the p(i)-th position before the vector edge is connected to the vector check node. In other words, this permutation makes the i-th variable node within the related vector variable node connected to the p(i)-th check node within the related vector check node.

The permutations comprising H can be very simple without compromising performance, such as simple cyclic shifts and/or bit-reversals. For instance, a simple circular right shift can be used. With this constraint, each H matrix can be uniquely represented by a $m_b \times n_b$ model matrix $H_{bm}$, which can be obtained by replacing each 0 in $H_b$ by −1 to denote a z×z all-zero submatrix (i.e., a null submatrix), and replacing each $h_{i,j}=1$ in $H_b$ by a circular shift size p(i,j) where p(i,j) is non-negative.

Note that the model matrix can also be referred to as a matrix prototype. Additionally note that the z×z all-zero submatrix (null submatrix) may also be represented using '−' or by any other designator.

Figure 2:
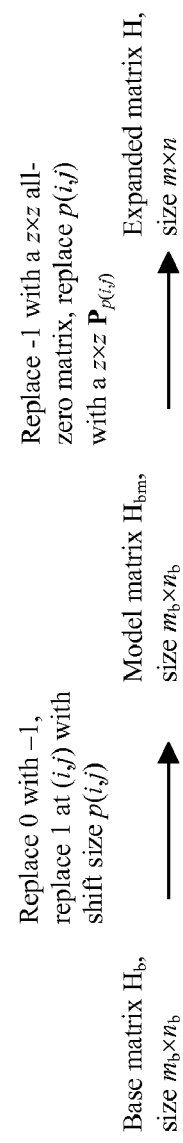
FIG. 2 illustrates the relationships between the base matrix $H_b$, the model matrix $H_{bm}$, and the final expanded matrix H.

Since circular left shift (x mod z) times is equivalent to circular right shift ((z−x) mod z) times, it is adequate to discuss circular right shift and refer it as a circular shift for brevity. As discussed previously, there is a one-to-one mapping between H and $H_{bm}$. Therefore, $H_{bm}$ is a shorthand representation of H if z is given. Notationally, the matrix prototype is distinguished from the base matrix by the subscript 'bm', and the expanded matrix is distinguished by removing the subscript 'bm'. The relationship between the three matrices is illustrated in FIG. 2. Using the structure, the code has error-correcting performance similar to a random H of size m×n, while encoding and decoding are performed based on a much smaller $H_{bm}$.

For example, the matrix of Equation (2) may be used as a base matrix $H_b$ to build a matrix prototype $H_{bm}$ as follows:

$$H_{bm} = \left[ \begin{array}{cccccc|cccccc} 1 & -1 & 0 & -1 & -1 & -1 & 0 & 0 & -1 & -1 & -1 & -1 \\ -1 & 2 & -1 & -1 & 0 & -1 & -1 & 0 & 0 & -1 & -1 & -1 \\ -1 & -1 & 1 & -1 & -1 & 2 & 2 & -1 & 0 & 0 & -1 & -1 \\ 2 & -1 & -1 & 1 & -1 & -1 & -1 & -1 & -1 & 0 & 0 & -1 \\ -1 & 1 & -1 & -1 & 0 & -1 & -1 & -1 & -1 & -1 & 0 & 0 \\ -1 & -1 & -1 & 0 & -1 & 1 & 0 & -1 & -1 & -1 & -1 & 0 \end{array} \right\} m_b. \qquad (4)$$

$$\underbrace{\phantom{xxxxxxxxxxxxxxxxxxxxxxxxxxxxxxxxxxxxxxxxxxxxxxxxxxxxxxx}}_{n_b}$$

When z=3, $H_{bm}$ is converted to a $(m_b \times z) \times (n_b \times z)$ matrix H by replacing each −1 with a 3×3 all-zero submatrix and each i with submatrix $P_i$, i=0, 1, 2, where $$P_0 = \begin{bmatrix} 1 & 0 & 0 \\ 0 & 1 & 0 \\ 0 & 0 & 1 \end{bmatrix}, \quad P_1 = \begin{bmatrix} 0 & 1 & 0 \\ 0 & 0 & 1 \\ 1 & 0 & 0 \end{bmatrix}, \quad P_2 = \begin{bmatrix} 0 & 0 & 1 \\ 1 & 0 & 0 \\ 0 & 1 & 0 \end{bmatrix}.$$

Note that $P_0$ is the z×z identity matrix. The cyclic-permutation matrix $P_i$ is obtained from the z×z identity matrix by cyclically shifting the columns to the right by i elements, i>0.

Given a vector $q=[q_0, q_1, q_2]$, $qP_0=[q_0, q_1, q_2]$, $qP_1=[q_2, q_0, q_1]$, $qP_2=[q_1, q_2, q_0]$. In other words, $qP_i$ results in circular right shift of the vector q. On the other hand, $P_i q^T$, results in circular upper shift of $q^T$, or equivalently circular left shift of q. Similar rules apply when a z×z matrix Q is used: $QP_i$ results in circular right shift of the columns of Q, $P_i Q$ results in circular upper shift of the rows of Q.

Base Matrix H

For an LDPC code without vectorization, an H matrix with a modified staircase structure for the parity part of H leads to efficient encoding without compromising performance. In general, assuming $x=[s\ p]=[s_0, s_1, \ldots, s_{k-1}, p_0, p_1, \ldots, p_{m-1}]$, an m-by-n H matrix can be divided into two submatrices, $$H=[H_1\ H_2], \qquad (5)$$

where $H_2$ has a modified staircase structure, and $H_1$ can be any binary matrix of size m-by-k. This same structure can be used to build the base matrix $H_b$ in a structured LDPC design. Similarly, using the modified staircase structure, $H_b$ can be partitioned into two sections, where $H_{b1}$ corresponds to the systematic bits s, $H_{b2}$ corresponds to the parity-check bits p:

$$H_b = [\ (H_{b1})_{m_b \times k_b}\ |\ (H_{b2})_{m_b \times m_b}\ ]. \qquad (6)$$

Section $H_{b2}$ can be further partitioned into two sections, where vector $h_b$ has odd weight $w_h$, and $H'_{b2}$ has a staircase structure:

$$H_{b2} = [\ h_b\ |\ H'_{b2}\ ] \qquad (7)$$

$$= \begin{bmatrix} h_b(0) & 1 \\ h_b(1) & 1 & 1 & & & 0 \\ \vdots & & 1 & \ddots \\ \vdots & & & \ddots & 1 \\ \vdots & & 0 & & 1 & 1 \\ h_b(m_b - 1) & & & & & 1 \end{bmatrix}.$$

Section $H_{b1}$ can be built randomly. Preferably the entire matrix $H_b$ has a weight distribution as close to the desired weight distribution as possible.

Shift Sizes

To convert the base matrix $H_b$ to the $m_b \times n_b$ matrix prototype $H_{bm}$ (which expands to H), the circular shift sizes p(i,j) need to be determined for each 1 in $H_b$. The shift sizes can be first specified for the $H_2$. After the shift sizes for the $H_2$ section are determined, the $H_1$ section shift sizes can be determined to achieve overall good performance of H. The $H_1$ portion of the base matrix and the shift sizes of the $H_1$ portion of the base matrix (section $H_{bm1}$) can be assigned in many different ways. For example, random values for the shift sizes may be selected and accepted if the shift sizes do not cause significant performance degradation. Performance degradation may result from the introduction of excessive numbers of short-length cycles or low-weight codewords. Other techniques available in the LDPC art may also be used.

The circular shift sizes p(i,j) for a given target H size should be specified to allow efficient encoding without compromising decoding performance. To facilitate encoding, the shifts may be assigned such that all but one of the shift matrices corresponding to 1's in $h_b$ cancel when added together, and all vector rows of $H'_{b2}$ cancel when summed up. This translates to assigning shift sizes to $h_b$ in pairs except for one entry, and assigning the same shift size to both 1's in each column of $H'_{b2}$. For example, if $h_b = [1\ 0\ 0\ 1\ 0\ 0\ 1]^T$, it is acceptable to have $h_{bm} = [3\ -1\ -1\ 3\ -1\ -1\ 4]^T$ as the corresponding column in the matrix prototype since shift size 3 is assigned in pairs. Since all of the non-zero entries (both 1's) in each column $H'_{b2}$ are assigned the same shift sizes, any shift size option is equivalent to the shift size of 0 (i.e., identity submatrices) plus a permutation of the bits within the vector column. Thus, all shift sizes of $H'_{b2}$ can be assigned 0 for convenience, i.e., each 1 in $H'_{b2}$ is replaced by a z×z identity submatrix when expanding to H.

Due to existence of cycles, the shift sizes of $h_{bm}$ should be assigned carefully. Rules can be applied to avoid forming short cycles or low weight codewords. One property that can be used to avoid cycles is:

If 2c edges form a cycle of length 2c in base matrix $H_b$, then the corresponding 2c vector edges form z cycles of length 2c in the expanded matrix H if and only if $$\sum_{\substack{i=2j \\ j=0,\ldots,c-1}} p(i) = \sum_{\substack{i=2j+1 \\ j=0,\ldots,c-1}} p(i) \bmod z, \quad (8)$$

where z is the expansion factor, p(i) is the circular shift size of edge i in the matrix prototype $H_{bm}$, and edge 0, 1, 2, ..., 2c−1 (in this order) form a cycle in $H_b$.

Due to the structure of $H_{b2}$, cycles exist between $h_b$ and $H'_{b2}$. Thus any two identical shift sizes in $h_{bm}$ would result in replicating the cycle z times in the expanded matrix H according to the above property. However, if these two shifts are located far apart, then the cycles have long length, and have little effect on iterative decoding. Therefore, in a preferred embodiment, when $h_b$ of the base matrix has three 1s, to maximize the cycle length, two 1s that are assigned equal shift sizes can be located at the top and the bottom of $h_{bm}$ (as far apart as possible), while leaving one 1 in the middle of $h_b$ with an unpaired shift size. For instance, $h_{bm} = [3\ -1\ 3\ -1\ -1\ -1\ 4]^T$ would result in z cycles of length 6 between h and $H'_2$, while $h_{bm} = [3\ -1\ 4\ -1\ -1\ -1\ 3]^T$ would result in z cycles of length 14 between h and $H'^2$, where h and $H'^2$ are expanded from $h_b$ and $H'_{b2}$.

In summary, the $H_{b2}$ section is mapped to the matrix prototype $$H_{bm2} = [\ h_{bm}\ |\ H'_{bm2}\ ] \quad (9)$$

$$= \begin{bmatrix} p(0, k_b) & p(0, k_b + 1) \\ p(1, k_b) & p(1, k_b + 1) & p(1, k_b + 2) \\ \vdots & & p(2, k_b + 2) & \ddots \\ & & & \ddots & p(m_b - 3, n_b - 2) \\ & & & & p(m_b - 2, n_b - 2) & p(m_b - 2, n_b - 1) \\ p(m_b - 1, k_b) & & & & & p(m_b - 1, n_b - 1) \end{bmatrix},$$

where $k_b = n_b - m_b$, there are $w_h$ (odd, $w_h \geq 3$) nonnegative entries in $h_{bm}$, and the −1 entries in $H'_{bm2}$ are left blank for brevity. All p(i,k) values appear an even number of times in $h_{bm}$ except for one, which may be mapped to any non-zero submatrix. Therefore, all $w_h$ shifts could be given the same value (e.g., 0), since $w_h$ is odd. For $H'_{bm2}$, p(i,j)=p(i+1,j), j=$k_b$+1, $k_b$+2, ..., $n_b$−1, i=j−$k_b$−1. In the preferred embodiment, assuming $w_h$=3, one example has $h_{bm}$=[0 −1 ... −1 $p_h$−1 ... −1 ... 0]$^T$, $p_h$ mod z≠0, and p(i,j)=p(i+1,j)=0, j=$k_b$+1, $k_b$+2, ..., $n_b$−1, i=j−$k_b$−1 in the $H'_{bm2}$ portion.

Although the discussion above focused on using submatrices that are circular shifts of the identity matrix, in general, any other submatrices may be used (and be represented in an equivalent to the base matrix prototype). In order to facilitate encoding, the constraints are then:

1. In every column of $H'_{bm2}$, the two non-zero submatrices are identical;

2. The $w_h$ (odd, $w_h \geq 3$) non-zero submatrices of $h_{bm}$ are paired (i.e., one submatrix is identical to another submatrix), except for one submatrix, which can be any non-zero matrix.

Encoding

Encoding is the process of determining the parity sequence p given an information sequence s. To encode the structured LDPC code, each operation is performed over a group of z bits instead of a single bit. Alternatively, vector operations do not have to be used, and the equations below are implemented in equivalent scalar form. To encode, s is divided into $k_b = n_b - m_b$ groups of z bits. Let this grouped s be denoted u, $$u = [u(0) u(1) \ldots u(k_b-1)], \quad (10)$$

where each element of u is a column vector as follows $$u(i) = [s_{iz} s_{iz+1} \ldots s_{(i+1)z-1}]^T. \quad (11)$$

Using the matrix prototype $H_{bm}$, the parity sequence p is determined in groups of z. Let the grouped p be denoted v, $$v = [v(0) v(1) \ldots v(m_b-1)], \quad (12)$$

where each element of v is a column vector as follows $$v(i) = [p_{iz} p_{iz+1} \ldots p_{(i+1)z-1}]^T. \quad (13)$$

Encoding proceeds in two steps, (a) initialization, which determines v(0), and (b) recursion, which determines v(i+1) from v(i), $0 \leq i \leq m_b - 2$.

An expression for v(0) can be derived by summing over the rows of Equation (1) to obtain $$P_{p(x,k_b)} v(0) = \sum_{j=0}^{k_b-1} \sum_{i=0}^{m_b-1} P_{p(i,j)} u(j) \quad (14)$$

where x is the row index of $h_{bm}$ where the entry is nonnegative and is used an odd number of times. In the preferred embodiment, the top and bottom entries of $h_{bm}$ are paired, thus $1 \leq x \leq m_b - 2$. Equation (14) is solved for v(0) by multiplying both sides by $P_{p(x,k_b)}^{-1}$. For the special case considered here where $p(x,k_b)$ represents a circular shift, $P_{p(x,k_b)}^{-1} = P_{z-p(x,k_b)}$. In other words, v(0) is obtained by $$v(0) = P_{z-p(x,k_b)} \sum_{j=0}^{k_b-1} \sum_{i=0}^{m_b-1} P_{p(i,j)} u(j). \quad (15)$$

In general, the recursions expressed in Equations (16) and (17) can be derived by considering the structure of $H'_{b2}$, $$P_{p(i,k_b+1)} v(1) = \sum_{j=0}^{k_b-1} P_{p(i,j)} u(j) + P_{p(i,k_b)} v(0), \quad i = 0, \quad (16)$$

and $$P_{p(i,k_b+i+1)} v(i+1) = P_{p(i,k_b+i)} v(i) + \sum_{j=0}^{k_b-1} P_{p(i,j)} u(j) + P_{p(i,k_b)} v(0), \quad (17)$$

$$i = 1, \ldots, m_b - 2,$$

where $$P_{-1} \equiv 0_{z \times z}. \quad (18)$$

Thus all parity bits not in v(0) are determined by iteratively evaluating Equations (16) and (17) for $0 \leq i \leq m_b - 2$.

In a preferred embodiment where the shifts sizes of the 1's in $H'_{b2}$ are all zero, Equations (16) and (17) can be simplified to Equations (19) and (20), $$v(1) = \sum_{j=0}^{k_b-1} P_{p(i,j)} u(j) + P_{p(i,k_b)} v(0), \quad i = 0, \quad (19)$$

and $$v(i+1) = v(i) + \sum_{j=0}^{k_b-1} P_{p(i,j)} u(j) + P_{p(i,k_b)} v(0), \quad (20)$$

$$i = 1, \ldots, m_b - 2.$$

Thus, as in the general case, all parity bits not in v(0) are determined by iteratively evaluating Equation (19) and (20) for $0 \leq i \leq m_b - 2$.

Equations (14), (19), and (20) describe the encoding algorithm. These equations also have a straightforward interpretation in terms of standard digital logic architectures. First, since the non-negative elements p(i,j) of $H_{bm}$ represent circular shift sizes of a vector, all products of the form $P_{p(i,j)} u(j)$ can be implemented by a size-z barrel shifter. A circular shift size of zero may not need to be barrel-shifted. Since a barrel shifter that implements all possible circular shifts must provide connections from each input bit to all output bits, the speed with which it can be run depends upon z. For a given z, complexity can be reduced and speed increased by allowing only a proper subset of all possible circular shifts. For instance, $H_{bm}$ could be constructed with only even circular shift sizes. The summations in Equations (14), (19), and (20) represent vector-wise XOR (exclusive OR) operations that are gated (i.e., do not update) when p(i,j)=−1. In the preferred embodiment of the present invention H is represented by any or no column or row-permuted version of the matrix prototype $H_{bm}$ which is equal to:

| 40 | –  | –  | –  | 22 | –  | 49 | 23 | 43 | –  | –  | –  | 1  | 0  | –  | –  | –  | –  | –  | –  | –  | –  | –  | – |
|----|----|----|----|----|----|----|----|----|----|----|----|----|----|----|----|----|----|----|----|----|----|----|----|
| 50 | 1  | –  | –  | 48 | 35 | –  | –  | 13 | –  | 30 | –  | –  | 0  | 0  | –  | –  | –  | –  | –  | –  | –  | –  | – |
| 39 | 50 | –  | –  | 4  | –  | 2  | –  | –  | –  | –  | 49 | –  | –  | 0  | 0  | –  | –  | –  | –  | –  | –  | –  | – |
| 33 | –  | –  | 38 | 37 | –  | –  | 4  | 1  | –  | –  | –  | –  | –  | –  | 0  | 0  | –  | –  | –  | –  | –  | –  | – |
| 45 | –  | –  | –  | 0  | 22 | –  | –  | 20 | 42 | –  | –  | –  | –  | –  | –  | 0  | 0  | –  | –  | –  | –  | –  | – |

-continued

```
51  -  -  48 35  -  -  -  44  -  18  -  -  -  -  -  -  0  0  -  -  -  -  -  -
47 11  -  -  -  17  -  -  51  -  -  -  0  -  -  -  -  -  0  0  -  -  -  -
 5  -  25  -  6  -  45  -  13 40  -  -  -  -  -  -  -  -  0  0  -  -  -
33  -  -  34 24  -  -  -  23  -  -  46  -  -  -  -  -  -  -  0  0  -  -
 1  -  27  -  1  -  -  -  38  -  44  -  -  -  -  -  -  -  -  -  0  0  -
 -  18  -  -  23  -  -  8  0 35  -  -  -  -  -  -  -  -  -  -  -  0  0
49  -  17  -  30  -  -  -  34  -  -  19  1  -  -  -  -  -  -  -  -  -  0.
```

Note that using the '–' is equivalent to putting a '–1' or any other designator for the z×z all-zero submatrix.

An example of a column-permuted version of the matrix prototype $H_{bm}$ wherein the high weight columns appear on the left hand side is shown below.

```
43 22 40  -  -  -  23 49  -  -  -  1  0  -  -  -  -  -  -  -  -  -  -  -
13 48 50  1  -  30  -  -  -  35  -  -  -  0  0  -  -  -  -  -  -  -  -  -
 -  4  39 50 49  -  -  -  2  -  -  -  -  -  0  0  -  -  -  -  -  -  -  -
 1 37 33  -  -  -  -  4  -  -  38  -  -  -  -  0  0  -  -  -  -  -  -  -
20  0  45  -  -  -  42  -  -  22  -  -  -  -  -  -  0  0  -  -  -  -  -  -
44 35 51  -  -  18  -  -  -  -  48  -  -  -  -  -  -  0  0  -  -  -  -  -
51  -  47 11  -  -  -  -  -  17  -  -  0  -  -  -  -  -  0  0  -  -  -  -
13  6  5  -  -  -  40  -  45  -  25  -  -  -  -  -  -  -  -  0  0  -  -  -
23 24 33  -  46  -  -  -  -  -  34  -  -  -  -  -  -  -  -  -  0  0  -  -
38  1  1  -  -  44  -  -  -  -  27  -  -  -  -  -  -  -  -  -  -  0  0  -
 0 23  -  18  -  -  35  8  -  -  -  -  -  -  -  -  -  -  -  -  -  -  0  0
34 30 49  -  19  -  -  -  -  -  -  17  1  -  -  -  -  -  -  -  -  -  -  0.
```

The matrix prototype $H_{bm}$ may be expanded with z=54 to define a rate ½ code with n=1296. Following are two more examples of model matrices that may be expanded to defined rate ½ codes for different values of n.

A rate ½ code with n=1944 may be defined by expanding any or no column or row-permuted version of the following matrix prototype $H_{bm}$ and using z=81:

```
 -  -  -  18 32  -  10  4  -  -  -  19  1  0  -  -  -  -  -  -  -  -  -  -
 -  -  -  47  -  47  -  28  8  -  34 20  -  0  0  -  -  -  -  -  -  -  -  -
 -  71  -  1  -  -  22 37  -  -  -  25  -  -  0  0  -  -  -  -  -  -  -  -
 8  -  -  6  47  -  -  53  1  -  -  -  -  -  -  0  0  -  -  -  -  -  -  -
 -  -  23 45  -  -  60 22  -  -  51 74  -  -  -  -  0  0  -  -  -  -  -  -
 -  78  -  28  -  56  -  32  -  -  -  26  -  -  -  -  -  0  0  -  -  -  -  -
 -  -  -  67  -  -  -  -  15 49  8  0  -  -  -  -  -  -  0  0  -  -  -  -
41  -  -  20  -  45  -  48  -  -  -  48  -  -  -  -  -  -  -  0  0  -  -  -
 -  -  14 44  -  -  -  9  -  71  -  41  -  -  -  -  -  -  -  -  0  0  -  -
 -  72  -  -  3  -  -  16  -  -  66  9  -  -  -  -  -  -  -  -  -  0  0  -
```

-continued

```
28  -  -   1  -  -  -  42  -  41  -  62  -  -  -  -  -  -  -  -  -  -  0  0
-   -  76  19 -  -  -  21  34 -   -  32  1  -  -  -  -  -  -  -  -  -  -  0
```

A rate ½ code with n=648 may be defined by expanding any or no column or row-permuted version of the following matrix prototype $H_{bm}$ and using z=27:

```
24  -  -  18 20  -  -  23  -   -  -  13  1  0  -  -  -  -  -  -  -  -  -  -
-  21  -  17  -  -  -  26  -  17  -  24  -  0  0  -  -  -  -  -  -  -  -  -
-   -  -  16 10  0  -   8  -   -  5  20  -  -  0  0  -  -  -  -  -  -  -  -
-   -  25 19  -  -  10 25  -   -  -  19  -  -  -  0  0  -  -  -  -  -  -  -
17  -  -  24  -  1  -  26  -   -  -  23  -  -  -  -  0  0  -  -  -  -  -  -
-   -  -   0 15  -  3  14  - 15  -   -  -  -  -  -  -  0  0  -  -  -  -  -
-   -  -  11  -  23  -  19  -  -  -  21  0  -  -  -  -  -  0  0  -  -  -  -
-  24  -   -  -   -  -  24  6  -  16 20  -  -  -  -  -  -  -  0  0  -  -  -
-   -  11 16  -   -  -   -  -  -  12 14 12  -  -  -  -  -  -  -  0  0  -  -
 5  -  -   0  -   -  -  10 23  -   -  18  -  -  -  -  -  -  -  -  -  0  0  -
-  26  -  14  -   -  19  2  -   -  7   7  -  -  -  -  -  -  -  -  -  -  0  0
-   -  -  17 23   -  -  13  1  -   -   8  1  -  -  -  -  -  -  -  -  -  -  0
```

To implement the summations in Equations (14), (19), and (20) the entries p(i,j) of $H_{bm}$, $0 \leq i \leq k_b$, $0 \leq j \leq m_b - 1$, can be stored in a read-only memory (ROM) of width $\lceil \log_2 z \rceil + 1$ bits. The grouped information sequence can be stored in a size-z memory, which can be read out in sequential order. As each information vector u(j) is read out, the corresponding entry from the $H_{bm}$ ROM can be read out, which instructs the barrel shifter of the necessary circular shift. After the circular shift, a register containing a partial summation is updated. For Equation (14), after each inner summation is completed, the result can be used to update another register containing the outer summation. When the outer summation is complete, it can be circularly shifted by $z-p(x,k_b)$.

Assuming the barrel shifting can be implemented in a single clock cycle, encoding can be accomplished in approximately $(k_b+1)m_b$ clock cycles. This number can be reduced at the expense of $m_b-1$ extra z-wide registers by computing and storing the summations of Equation (19) and (20), using results that become available as Equation (14) is being computed.

Extending the Matrix

The code extension procedure can be applied to the structured code to reach a lower-rate code. Progressively lower-rate code can be used in successive transmissions of an incremental redundancy (IR) procedure. Specifically, if the matrix prototype of the $1^{sty}$ transmission is $$H_{bm}^{(1)} = [H_{bm1}^{(1)} \; H_{bm2}^{(1)}], \tag{21}$$

then the matrix prototype for the $2^{nd}$ transmission may use $$H_{bm}^{(2)} = \begin{bmatrix} H_{bm1}^{(1)} & H_{bm2}^{(1)} & 0 \\ H_{bm1}^{(2)} & & H_{bm2}^{(2)} \end{bmatrix}, \tag{22}$$

etc., where for each transmission i, submatrix $H_{bm2}^{(i)}$ has the format in (9) and has size $m_b^{(i)} \times m_b^{(i)}$. The first transmission may send $n_b^{(1)} = k_b + m_b^{(1)}$ groups of bits, $[u(0), u(1), \ldots, u(k_b-1), v^{(1)}(0), v^{(1)}(1), \ldots, v^{(1)}(m_b^{(1)}-1)]$, each group having size z. The decoding after the $1^{sty}$ transmission is performed using received signals of $[u(0), u(1), \ldots, u(k_b-1), v^{(1)}(0), v^{(1)}(1), \ldots, v^{(1)}(m_b^{(1)}-1)]$ and (21). The $2^{nd}$ transmission may send another $m_b^{(2)}$ groups of bits of size z, $[v^{(2)}(0), v^{(2)}(1), \ldots, v^{(2)}(m_b^{(2)}-1)]$, where $m_2 = m_b^{(2)} z$, and the bits of the first transmission and the second transmission together, $[u(0), u(1), \ldots, u(k_b-1), v^{(1)}(0), v^{(1)}(1), \ldots, v^{(1)}(m_b^{(1)}-1), v^{(2)}(0), v^{(2)}(1), \ldots, v^{(2)}(m_b^{(2)}-1)]$, are a codeword corresponding to (22). Therefore, the decoding after the second transmission is performed based on (22) and the combined received signal from the $1^{sty}$ transmission and the $2^{nd}$ transmission. This procedure may be repeated for more transmissions. The decoding after the $2^{nd}$ transmission is based on a code of rate $k_b/n_b^{(2)} = k_b/(n_b^{(1)} + m_b^{(2)})$, which is lower than that of $1^{sty}$ transmission. This procedure may be repeated for more transmissions, with each additional transmission contributing to a stronger, lower-rate code.

Figure 5:
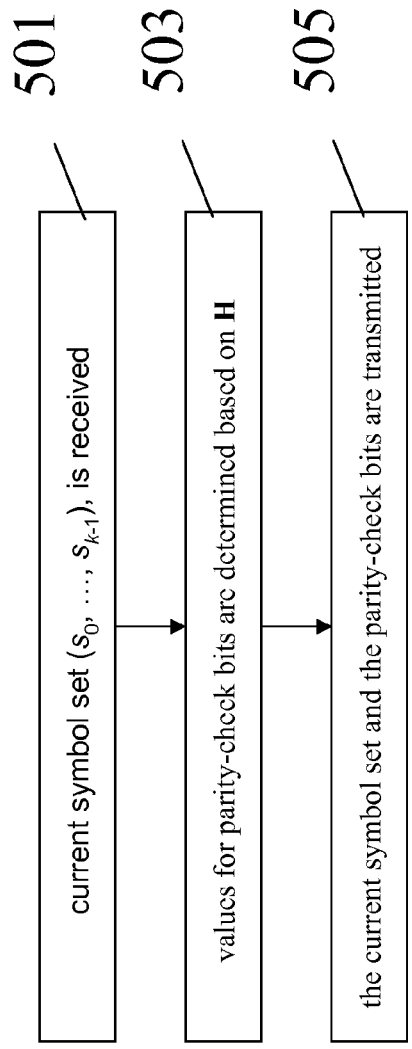
FIG. 5 is a flow chart showing the operation of the encoder of FIG. 3.

FIG. 5 is a flow chart showing the operation of encoder 300, and in particular, microprocessor 301. The logic flow begins at step 501 where a current symbol set $(s_0, \ldots, s_{k-1})$ is received by microprocessor 301. At step 503, values of parity-check bits are determined based on the current symbol set and H. In particular, the parity-check bits $(p_0, \ldots, p_{m-1})$ are determined as described above, with H being an expansion of a base matrix $H_b$. As discussed, $H_b$ comprises a section $H_{b1}$ and a section $H_{b2}$, and wherein $H_{b2}$ comprises a first part comprising a column $h_b$ having an odd weight greater than 2, and a second part comprising matrix elements for row i, column j equal to 1 for i=j, 1 for i=j+1, and 0 elsewhere. In addition, the expansion of the base matrix $H_b$ (to produce H) uses identical submatrices for the 1s in each column of the second part $H'_{b2}$, and wherein the expansion uses paired submatrices for an even number of 1s in $h_b$. At step 505 the current symbol set and the parity-check bits are transmitted via over-the-air transmission.

Figure 6:
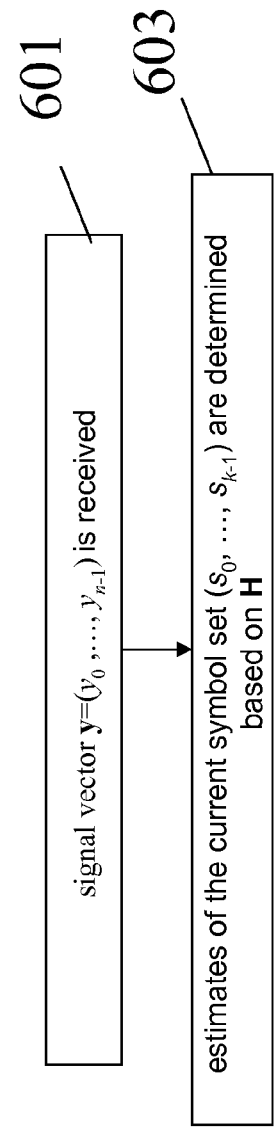
FIG. 6 is a flow chart showing the operation of the decoder of FIG. 4.

FIG. 6 is a flow chart showing the operation of decoder 400, and in particular, microprocessor 401. The logic flow begins at step 601 where the received signal vector $y=(y_0, \ldots, y_{n-1})$ is received. At step 603, estimates of the current symbol set s (i.e., the current symbol set $(s_0, \ldots, s_{k-1})$) are determined based on H. As discussed, H is an expansion of a base matrix $H_b$ and wherein $H_b$ comprises a section $H_{b1}$ and a section $H_{b2}$, and wherein $H_{b2}$ comprises a first part comprising a column $h_b$ having an odd weight greater than 2, and a second part comprising matrix elements for row i, column j equal to 1 for i=j, 1 for i=j+1, and 0 elsewhere.

While the invention has been particularly shown and described with reference to a particular embodiment, it will be understood by those skilled in the art that various changes in form and details may be made therein without departing from the spirit and scope of the invention. For example, while the invention has been shown with the ordering of $s_i$ and $p_i$ within x defined, one of ordinary skill in the art will recognize that other ordering of the bits within x can occur since the codeword bits can be collected in any order as long as the columns of H are reordered accordingly. Additionally, while the above-description has been particularly shown and described with reference to binary codes (i.e., codes defined over the Galois Field GF(2)), one of ordinary skill in the art will recognize that an arbitrary GF may be utilized as well. Although the examples given above are shown in one format, other formats are possible which allow similar encoding and code modification procedure. For example, the rows of H may be permuted without affecting the value of the parity-check bits. In another example, the modified staircase structure may be used for a subset of the parity-check bits. In yet another example, additional steps may be performed when expanding the base matrix to the expanded matrix. The matrix H may also be used in any type of decoder that relies upon a parity-check matrix. It is intended that such changes come within the scope of the following claims.

The invention claimed is:

1. A method for operating a transmitter that generates parity-check bits $p=(p_0, \ldots, p_{m-1})$ based on a current symbol set $s=(s_0, \ldots, s_{k-1})$, the method comprising the steps of:

receiving the current symbol set $s=(s_0, \ldots, s_{k-1})$;

using a matrix H to determine the parity-check bits wherein H is represented by $H_{bm}$ or a column or row permutation of the matrix $H_{bm}$, where $H_{bm}=$

```
40  -  -  -  22  -  49  23  43  -   -   -
50  1  -  -  48  35  -   -   13  -   30  -
39 50  -  -   4  -    2  -   -   -   -  49
33  -  -  38  37  -   -    4   1  -   -   -
45  -  -  -    0  22  -   -   20  42  -   -
51  -  -  48  35  -   -   -   44  -   18  -
47 11  -  -   -   17  -   -   51  -   -   -
 5  - 25  -   6   -  45   -   13  40  -   -
33  -  -  34  24  -   -   -   23  -   -  46
 1  - 27  -   1   -   -   -   38  -   44  -
 -  18 -  -   23  -   -    8   0  35  -   -
49  - 17  -   30  -   -   -   34  -   -  19
```

```
1  0  -  -  -  -  -  -  -  -  -  -
-  0  0  -  -  -  -  -  -  -  -  -
-  -  0  0  -  -  -  -  -  -  -  -
-  -  -  0  0  -  -  -  -  -  -  -
-  -  -  -  0  0  -  -  -  -  -  -
-  -  -  -  -  0  0  -  -  -  -  -
0  -  -  -  -  -  0  0  -  -  -  -
-  -  -  -  -  -  -  0  0  -  -  -
-  -  -  -  -  -  -  -  0  0  -  -
-  -  -  -  -  -  -  -  -  0  0  -
-  -  -  -  -  -  -  -  -  -  0  0
1  -  -  -  -  -  -  -  -  -  -  0;
``` and transmitting the parity-check bits along with the current symbol set.

2. The method of claim 1 wherein:

H is an expansion of a base matrix $H_b$ with $H_b$ comprising a section $H_{b1}$ and a section $H_{b2}$, with $H_{b2}$ comprising a first part having a column $h_b$ having an odd weight greater than 2, and a second part $H'_{b2}$ comprising matrix elements for row i, column j equal to 1 for i=j, 1 for i=j+1, 0 elsewhere;

wherein the expansion of the base matrix $H_b$ uses identical submatrices for 1s in each column of the second part $H'_{b2}$, and wherein the expansion uses paired submatrices for an even number of 1s in $h_b$.

3. The method of claim 1 wherein the parity-check matrix H can be partitioned into square subblocks (submatrices) of size z×z, where subblock size is z=54 bits.

4. The method of claim 3 wherein the submatrices are either cyclic-permutations of the identity matrix or null submatrices.

5. The method of claim 3 wherein the cyclic-permutation matrix $P_i$ is obtained from the z×z identity matrix by cyclically shifting the columns to the right by i elements.

6. The method of claim 1 wherein the step of using matrix H to determine the parity-check bits $p=(p_0, \ldots, p_{m-1})$ comprises the step of determining $$v(0) = P_{z-p(x,k_b)} \sum_{j=0}^{k_b-1} \sum_{i=0}^{m_b-1} P_{p(i,j)} u(j),$$

where $u=[u(0)\ u(1)\ \ldots\ u(k_b-1)]$ is the current symbol set s grouped into $k_b$ groups of z bits, $v=[v(0)\ v(1)\ \ldots\ v(m_b-1)]$ is the parity-check bits p grouped into $m_b$ groups of z bits, $p(i,j)$ is a shift size, and multiplication by $P_x$ circularly shifts a vector by x positions.

7. The method of claim 1 wherein the step of using matrix H to determine the parity-check bits $(p_0, \ldots, p_{m-1})$ comprises the step of determining $$v(0) = P_{z-p(x,k_b)} \sum_{j=0}^{k_b-1} \sum_{i=0}^{m_b-1} P_{p(i,j)} u(j)$$

and determining $v(1), v(2), \ldots, v(m_b-1)$ recursively via $$v(1) = \sum_{j=0}^{k_b-1} P_{p(i,j)} u(j) + P_{p(i,k_b)} v(0), i = 0,$$

$$v(i+1) = v(i) + \sum_{j=0}^{k_b-1} P_{p(i,j)} u(j) + P_{p(i,k_b)} v(0), i = 1, \ldots, m_b - 2,$$

where $u=[u(0)\ u(1)\ \ldots\ u(k_b-1)]$ is the current symbol set s grouped into $k_b$ groups of z bits, $v=[v(0)\ v(1)\ \ldots\ v(m_b-1)]$ is the parity-check bits p grouped into $m_b$ groups of z bits, $p(i,j)$ is a shift size, and multiplication by $P_x$ circularly shifts a vector by x positions.

8. The method of claim 1 wherein the step of using matrix H to determine the parity-check bits $(p_0, \ldots, p_{m-1})$ comprises the step of determining $$v(0) = P_{z-p(x,k_b)} \sum_{j=0}^{k_b-1} \sum_{i=0}^{m_b-1} P_{p(i,j)} u(j)$$

and determining $v(1), v(2), \ldots, v(m_b-1)$ recursively, where $u=[u(0)\ u(1)\ \ldots\ u(k_b-1)]$ is the current symbol set s grouped into $k_b$ groups of z bits, $v=[v(0)\ v(1)\ \ldots\ v(m_b-1)]$ is the parity-check bits p grouped into $m_b$ groups of z bits, $p(i,j)$ is a shift size, and multiplication by $P_x$ circularly shifts a vector by x positions.

9. The method of claim 1 further comprising the steps of:

determining additional parity-check bits need to be transmitted; and transmitting the additional parity-check bits $(p_m, \ldots, p_{m+m_2-1})$ based on the current symbol set $s=(s_0, \ldots, s_{k-1})$ and $p=(p_0, \ldots, p_{m-1})$, where $m_2 = m_b^{(2)} z$.

10. The method of claim 9 further comprising the step of using a matrix Prototype $H_{bm}^{(2)}$ to determine the additional parity-check bits wherein $H_{bm}^{(2)}$ is based on $H_{bm}$.

11. A method for operating a receiver that estimates a current symbol set $s=(s_0, \ldots, s_{k-1})$, the method comprising the steps of:

receiving a received signal vector $y=(y_0 \ldots y_{n-1})$; and using a matrix H to estimate the current symbol set $s=(s_0, \ldots, s_{k-1})$, wherein matrix H is represented by $H_{bm}$ or a column or row permutation of the matrix $H_{bm}$, where $H_{bm}=$

```
40  -   -   -  22   -  49  23  43   -   -   1   0   -   -   -   -   -   -   -   -   -   -   -   -
50  1   -   -  48  35   -   -  13   -  30   -   -   0   0   -   -   -   -   -   -   -   -   -   -
39 50   -   -   4   -   2   -   -   -   -  49   -   -   0   0   -   -   -   -   -   -   -   -   -
33  -   -  38  37   -   -   4   1   -   -   -   -   -   -   0   0   -   -   -   -   -   -   -   -
45  -   -   -   0  22   -   -  20  42   -   -   -   -   -   -   0   0   -   -   -   -   -   -   -
51  -   -  48  35   -   -   -  44   -  18   -   -   -   -   -   -   0   0   -   -   -   -   -   -
47 11   -   -   -  17   -   -  51   -   -   -   0   -   -   -   -   -   0   0   -   -   -   -   -
 5  -  25   -   6   -  45   -  13  40   -   -   -   -   -   -   -   -   -   0   0   -   -   -   -
33  -   -  34  24   -   -   -  23   -   -  46   -   -   -   -   -   -   -   -   0   0   -   -   -
 1  -  27   -   1   -   -   -  38   -  44   -   -   -   -   -   -   -   -   -   -   0   0   -   -
 -  18   -   -  23   -   -   8   0  35   -   -   -   -   -   -   -   -   -   -   -   -   0   0   -
49  -  17   -  30   -   -   -  34   -   -  19   1   -   -   -   -   -   -   -   -   -   -   -   0.
```

12. The method of claim 11 wherein the parity-check matrix H can be partitioned into square subblocks (submatrices) of size $z \times z$, where subblock size is $z = 54$ bits.

13. The method of claim 12 wherein the submatrices are either cyclic-permutations of the identity matrix or null submatrices.

14. The method of claim 13 wherein the cyclic-permutation matrix $P_i$ is obtained from the $z \times z$ identity matrix by cyclically shifting the columns to the right by i elements.

15. An apparatus comprising:

storage means for storing a matrix H;

a microprocessor using a matrix H to determine parity-check bits; and a transmitter for transmitting the parity-check bits;

wherein matrix H is represented by $H_{bm}$ or a column or row permutation of the matrix $H_{bm}$, where $H_{bm}=$

| 40 | – | – | – | 22 | – | 49 | 23 | 43 | – | – | – | 1 | 0 | – | – | – | – | – | – | – | – | – | – |
| 50 | 1 | – | – | 48 | 35 | – | – | 13 | – | 30 | – | – | 0 | 0 | – | – | – | – | – | – | – | – | – |
| 39 | 50 | – | – | 4 | – | 2 | – | – | – | – | 49 | – | – | 0 | 0 | – | – | – | – | – | – | – | – |
| 33 | – | – | 38 | 37 | – | – | 4 | 1 | – | – | – | – | – | – | 0 | 0 | – | – | – | – | – | – | – |
| 45 | – | – | – | 0 | 22 | – | – | 20 | 42 | – | – | – | – | – | – | 0 | 0 | – | – | – | – | – | – |
| 51 | – | – | 48 | 35 | – | – | – | 44 | – | 18 | – | – | – | – | – | – | 0 | 0 | – | – | – | – | – |
| 47 | 11 | – | – | – | 17 | – | – | 51 | – | – | – | 0 | – | – | – | – | – | 0 | 0 | – | – | – | – |
| 5 | – | 25 | – | 6 | – | 45 | – | 13 | 40 | – | – | – | – | – | – | – | – | – | 0 | 0 | – | – | – |
| 33 | – | – | 34 | 24 | – | – | – | 23 | – | – | 46 | – | – | – | – | – | – | – | – | 0 | 0 | – | – |
| 1 | – | 27 | – | 1 | – | – | – | 38 | – | 44 | – | – | – | – | – | – | – | – | – | – | 0 | 0 | – |
| – | 18 | – | – | 23 | – | – | 8 | 0 | 35 | – | – | – | – | – | – | – | – | – | – | – | – | 0 | 0 |
| 49 | – | 17 | – | 30 | – | – | – | 34 | – | – | 19 | 1 | – | – | – | – | – | – | – | – | – | – | 0. |

16. An apparatus comprising:
   storage means for storing a matrix H;
   a receiver for receiving a signal vector $y=(y_0 \ldots y_{n-1})$; and
   a microprocessor using a matrix H to determine a current symbol set $(s_0, \ldots, s_{k-1})$, wherein matrix H is represented by $H_{bm}$ or a column or row permutation of the matrix $H_{bm}$, where $H_{bm}=$

| 40 | – | – | – | 22 | – | 49 | 23 | 43 | – | – | – | 1 | 0 | – | – | – | – | – | – | – | – | – | – |
| 50 | 1 | – | – | 48 | 35 | – | – | 13 | – | 30 | – | – | 0 | 0 | – | – | – | – | – | – | – | – | – |
| 39 | 50 | – | – | 4 | – | 2 | – | – | – | – | 49 | – | – | 0 | 0 | – | – | – | – | – | – | – | – |
| 33 | – | – | 38 | 37 | – | – | 4 | 1 | – | – | – | – | – | – | 0 | 0 | – | – | – | – | – | – | – |
| 45 | – | – | – | 0 | 22 | – | – | 20 | 42 | – | – | – | – | – | – | 0 | 0 | – | – | – | – | – | – |
| 51 | – | – | 48 | 35 | – | – | – | 44 | – | 18 | – | – | – | – | – | – | 0 | 0 | – | – | – | – | – |
| 47 | 11 | – | – | – | 17 | – | – | 51 | – | – | – | 0 | – | – | – | – | – | 0 | 0 | – | – | – | – |
| 5 | – | 25 | – | 6 | – | 45 | – | 13 | 40 | – | – | – | – | – | – | – | – | – | 0 | 0 | – | – | – |
| 33 | – | – | 34 | 24 | – | – | – | 23 | – | – | 46 | – | – | – | – | – | – | – | – | 0 | 0 | – | – |
| 1 | – | 27 | – | 1 | – | – | – | 38 | – | 44 | – | – | – | – | – | – | – | – | – | – | 0 | 0 | – |
| – | 18 | – | – | 23 | – | – | 8 | 0 | 35 | – | – | – | – | – | – | – | – | – | – | – | – | 0 | 0 |
| 49 | – | 17 | – | 30 | – | – | – | 34 | – | – | 19 | 1 | – | – | – | – | – | – | – | – | – | – | 0. |

\* \* \* \* \*

UNITED STATES PATENT AND TRADEMARK OFFICE
CERTIFICATE OF CORRECTION

PATENT NO. : 7,493,548 B2
APPLICATION NO. : 11/275937
DATED : February 17, 2009
INVENTOR(S) : Ajit Nimbalker et al.

It is certified that error appears in the above-identified patent and that said Letters Patent is hereby corrected as shown below:

ON THE TITLE PAGE

1. On the Face Page, in Field (75), under "Inventors", in Column 1, Line 2, delete "Yufei Blankenship," and insert -- Yufei W. Blankenship, --, therefor.

2. On the Face Page, in Field (75), under "Inventors", in Column 1, Line 3, delete "Brian Classon," and insert -- Brian K. Classon, --, therefor.

IN THE DRAWINGS

3. In Fig. 5, Sheet 4 of 4, for Tag "503", delete "valucs for parity-chcck bits arc dctcrmined based on H" and insert -- values for parity-check bits are determined based on H --, therefor.

IN THE SPECIFICATION

4. In Column 4, Line 16, delete "is" and insert -- 1s --, therefor.

5. In Column 8, Line 22, delete "is" and insert -- 1s --, therefor.

6. In Column 8, Line 28, delete "H$^{\prime 2}$" and insert -- H'$_2$, --, therefor.

7. In Column 8, Line 28, delete "H$^{\prime 2}$" and insert -- H'$_2$ --, therefor.

8. In Column 14, Line 37, in Equation (22), delete $$" \quad H^{(2)}_{bm} = \left[ \begin{array}{cc|c} H^{(1)}_{bm1} & H^{(2)}_{bm2} & 0 \\ \hline H^{(2)}_{bm1} & & H^{(2)}_{bm2} \end{array} \right] \quad "$$

and insert $$-- \quad H^{(2)}_{bm} = \left[ \begin{array}{cc|c} H^{(1)}_{bm1} & H^{(1)}_{bm2} & 0 \\ \hline H^{(2)}_{bm1} & & H^{(2)}_{bm2} \end{array} \right] \quad --, \text{therefor.}$$

UNITED STATES PATENT AND TRADEMARK OFFICE
CERTIFICATE OF CORRECTION

PATENT NO. : 7,493,548 B2
APPLICATION NO. : 11/275937
DATED : February 17, 2009
INVENTOR(S) : Ajit Nimbalker et al.

It is certified that error appears in the above-identified patent and that said Letters Patent is hereby corrected as shown below:

9. In Column 14, Line 45, delete "$1^{sty}$" and insert -- $1^{st}$ --, therefor.

10. In Column 14, Line 56, delete "$1^{sty}$" and insert -- $1^{st}$ --, therefor.

11. In Column 14, Line 60, delete "$1^{sty}$" and insert -- $1^{st}$ --, therefor.

12. In Column 18, Line 15, in Claim 10, delete "Prototype" and insert -- prototype --, therefor.

Signed and Sealed this

Twenty-ninth Day of December, 2009

David J. Kappos
*Director of the United States Patent and Trademark Office*